United States Patent [19]

Chamberlin, Jr.

[11] 4,177,409
[45] Dec. 4, 1979

[54] VIDEO AMPLIFIER FOR DISPLAYING FOUR OR MORE VIDEO LEVELS ON A CATHODE RAY TUBE

[75] Inventor: Howard A. Chamberlin, Jr., Manchester, N.H.

[73] Assignee: Hendrix Electronics Incorporated, Manchester, N.H.

[21] Appl. No.: 877,304

[22] Filed: Feb. 13, 1978

[51] Int. Cl.² .............................................. H01J 29/52
[52] U.S. Cl. ...................................... 315/383; 315/30
[58] Field of Search ..................... 315/30, 365, 383; 358/168, 171

[56] References Cited

U.S. PATENT DOCUMENTS

| 2,547,298 | 4/1951 | Smart | 315/383 |
| 3,946,275 | 3/1976 | Marino | 315/383 |

FOREIGN PATENT DOCUMENTS 1441887  7/1976  United Kingdom ................... 315/383

OTHER PUBLICATIONS

Jean-Claude Roy, *A High-Resolution Raster Scan Display*, Hewlett-Packard Journal, vol. 26, No. 10, pp. 11-15, Jun. 75.

*Primary Examiner*—Theodore M. Blum
*Attorney, Agent, or Firm*—Kenway & Jenney

[57] ABSTRACT

A video amplifier for decoding a digital signal input and providing at least three video brightness levels plus a black level to a cathode ray tube is disclosed. The amplifier includes input logic decoding circuitry for providing control signals to a plurality of switching elements which vary the voltage level of a video output signal. The video signal has at least four discrete voltage levels corresponding to a black, dim, normal, or bright display. The amplifier is preferably mounted on the socket of the cathode ray tube and provides a bandwidth on the order of 75 to 100 MHz.

8 Claims, 2 Drawing Figures

| INPUTS | | DIGITAL OUTPUTS | | | |
|---|---|---|---|---|---|
| line 16 | line 18 | line 30 | line 32 | line 34 | Cathode Voltage (approx) |
| 0 | 0 | 1 | 1 | 1 | 0 (bright) |
| 1 | 0 | 1 | 1 | 0 | +6 (normal) |
| 0 | 1 | 1 | 0 | 0 | +18 (dim) |
| 1 | 1 | 0 | 0 | 0 | +32 (black) |

VIDEO AMPLIFIER FOR DISPLAYING FOUR OR MORE VIDEO LEVELS ON A CATHODE RAY TUBE

The invention relates generally to cathode ray tube displays and in particular to a video amplifier for providing different display voltage levels to the cathode ray tube.

BACKGROUND OF THE INVENTION

Cathode ray tube (CRT) displays have been available for many years. The first cathode ray tube applications were primarily in television and oscilloscopes. Later, as computers developed, information display devices, employing a CRT responsive to a general purpose or special purpose digital computer, were developed to provide a two level, black-white, alphanumeric display. Often, the video amplifier driving the computer responsive display was the same video amplifier used in analog (television and oscilloscope) applications and consequently the earlier computer responsive displays had severe bandwidth constraints compared with the available digital switching rates. Soon thereafter, however, CRT displays for presenting alphanumerics employed video amplifiers having on-off solid state switching so that one brightness level and a black level could be displayed on the cathode ray tube face at a relatively high bandwidth.

As the applications in which the cathode ray tube displays were used increased in both complexity and sophistication, and to increase their appeal for the user, two levels of brightness (plus a black level) were provided to allow the user the option of emphasizing selected display material by using a different brightness background.

As the display applications of cathode ray tubes became yet more sophisticated, there continued a pressing need to increase the speed (or bandwidth) of the video circuitry driving the tube to provide a faster display and hence a "crisper" display, that is, a display having sharper edges and hence a generally more pleasing aesthetic appearance at high display rates. As a result, the assignee of the present invention has provided video displays having two brightness levels plus a black level (a total of three video levels) which operate at a video bandwidth of approximately 25-50 MHz.

A principle object of this invention is a video amplifier capable of operating at still higher speeds while providing greater brightness level flexibility. Other objects of the invention are a video amplifier having a relatively low cost, high reliability, and which can be a plug-in replacement for present slower video amplifiers. Still further objects of the invention are a video amplifier having a flexible decoding arrangement wherein different digital input signal coding can be accommodated.

SUMMARY OF THE INVENTION

A video amplifier according to the invention for generating at least four discrete output levels of video for a cathode ray tube display features an input decoding means for receiving at least two digital input lines and for providing at least three output signal lines, said output signal lines uniquely representing the state of the input lines, and at least first, second, and third two-state switch elements, each switch element being associated with and responsive to a different one of the output signal lines. Each switch element provides at respective first and second switch lines, a substantially short circuit in response to a first state of the associated output signal line and a substantially open circuit in response to the second state of the associated signal line. The amplifier further features means for providing a black video reference level to a video output line which, when applied to the cathode ray tube display, has sufficient potential to turn the cathode ray tube substantially off. The amplifier also features reference means associated with each switching element for connecting each first switch line to a common bright voltage reference level and voltage determining means associated with each switching element for connecting each second switch line to a video output line. The input decoding means, the switching elements, and the voltage determining means are connected to provide a priority switching system in which the video line (a) is held at the bright voltage reference level whenever the first switch element is in a first state, (b) is held at a normal voltage reference level when the second switch element is in the first state and the first switch element is in the second state, (c) is maintained at a dim reference voltage when the third switch element only is in the first state, and (d) is maintained at the black video reference when each switch element is in its second state. In addition, changes on the video line from one reference voltage level to another reference voltage level, in response to the change of digital input signal, are substantially monotonic, that is, the voltage changes from one reference level to the next substantially without overshoot or ambiguity. Thereby, at least four levels of video signal are obtained at the cathode ray tube display.

BRIEF DESCRIPTION OF THE DRAWINGS

Other objects, features and advantages of the invention will appear from the following description of a preferred embodiment of the invention taken together with the single sheet of drawings in which.

DESCRIPTION OF A PREFERRED EMBODIMENT

Figures 1, 2:
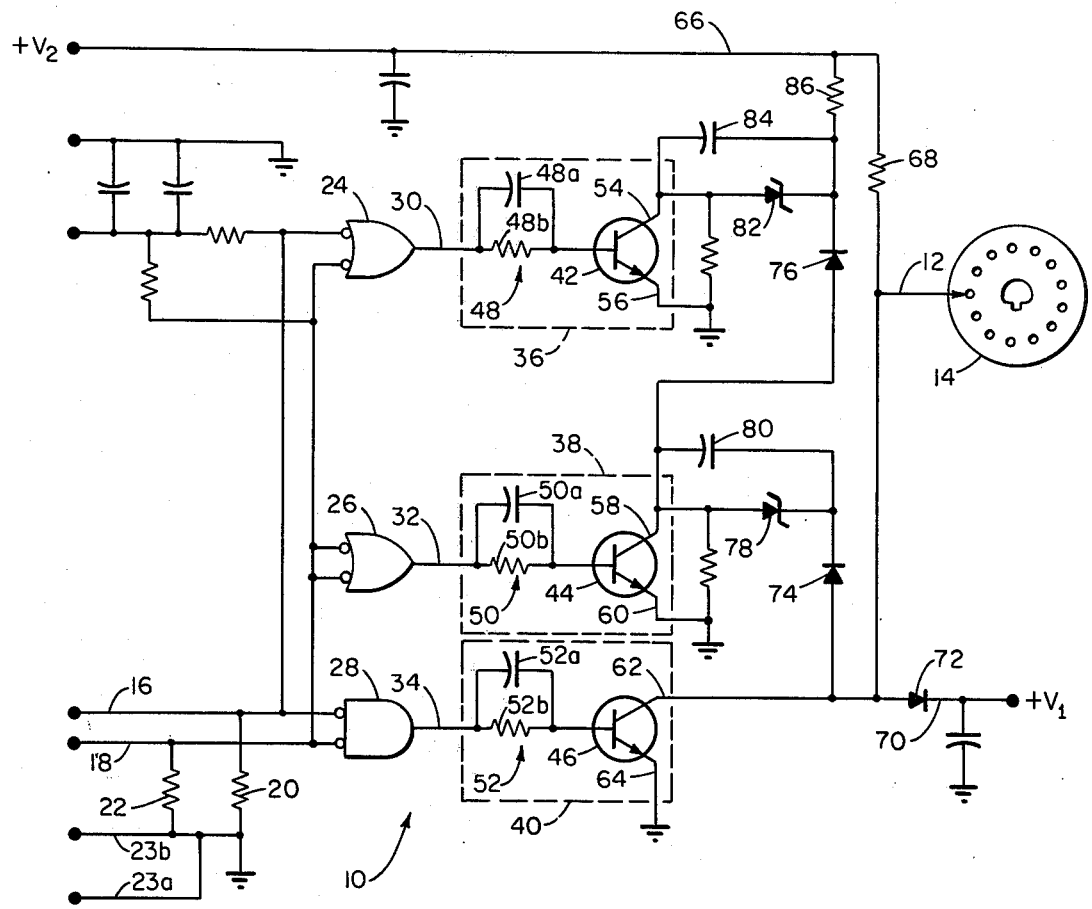
FIG. 1 is an electrical schematic of a preferred embodiment of a video amplifier according to the invention.
FIG. 2 is a table defining various voltage and logic levels of the circuit of FIG. 1.

Referring to FIG. 1, a video amplifier 10 has a video output 12 connected to the cathode of a cathode ray tube through a pin socket 14. (Other connections to the pin socket are well known in the art.) The video amplifier 10 receives digital input signals over lines 16 and 18. The input signals are binary signal levels which together represent, by their respective levels, one of four different output video levels to the cathode. The four different levels include three levels of brightness and a black level.

Referring to FIG. 2, the input levels on lines 16 and 18, arbitrarily labelled "0" and "1", represent the bright, normal, dim, and black output levels to the cathode ray tube. Thus, in the illustrated embodiment, a 0,0 input represents a bright output level; a 1,0 input represents a normal output brightness level; a 0,1 input represents a dim output brightness level; and a 1,1 input represents a black output video level. Resistors 20, 22 terminate input lines 16 and 18 and connect between lines 16 and 18 and their grounded shields 23a and 23b.

Lines 16 and 18 are applied directly to the illustrated decoding logic consisting of NAND gates 24, 26 and NOR gate 28. The logical outputs of gates 24, 26, and 28, over lines 30, 32, and 34 respectively, in response to the inputs on lines 16 and 18, are tabulated under the heading "Digital Outputs" in FIG. 2. In the notation used herein, a "1" represents a positive voltage signal and a "0" represents a substantially ground level.

The outputs of gates 24, 26, and 28 drive, respectively, identical switching elements 36, 38, and 40, each of which comprises a high speed saturated switching transistor 42, 44, 46 and a resistor-capacitance input circuitry 48, 50, 52, respectively consisting of capacitors 48a, 50a, 52a, and resistors 48b, 50b, 52b. In operation, when the input to a switching element 36, 38, or 40 is a "1" (positive voltage), the corresponding switch provides a substantially short circuit between its input switching lines 54, 56; 58, 60; and 62, 64, respectively. When the input to a switching element is a "0" (ground), the switch provides a substantially open circuit between its input switching lines.

The video output signal to the cathode of the cathode ray tube over line 12 is derived by connecting, across line 12, one or more of a plurality of switched voltage determining elements. When the digital input over lines 16, 18 is 1,1 calling for a black level, each of the switching elements 36, 38, and 40 is in an open circuited state; and hence the output voltage level on line 12 is derived solely from a high voltage input $V_2$ on line 66 through a resistor 68 which is clamped or limited by a fixed lower voltage level $V_1$ on line 70 through a diode 72. In the illustrated embodiment, line 66 is maintained at +85 volts DC while the reference voltage side of diode 72, line 70, is maintained at +33 volts DC. Thus, with each of switching elements 36, 38, 40 in the open circuited state, the output voltage to the CRT cathode on line 12 is about +33.7 volts. This corresponds to a black level.

In order to obtain fast switching from any one video level to any other level, switching elements 36, 38, and 40 are connected to "pull down" the voltage on line 12 which, except for the switching elements, would be held at the black level of about 33.7 volts by potential $V_1$ acting through diode 72. A reduction in voltage level effects a flow of cathode current and hence a brightening of the cathode ray tube face. To help maintain high switching speeds, resistor 68 is a relatively low resistance, for example 1200 ohms, and thus the voltage $V_2$ in combination with resistor 68 looks like a current source.

In the bright condition, called for by a 0,0 input level over lines 16, 18, each of the switching elements is turned on to provide a substantially short circuit across its input levels. However, switching element 40 will dominate, and forces the voltage on a line 12 to be substantially zero volts corresponding to the bright level. Diode 72 protects the voltage source $V_1$ on line 70, the diode being back biased when the output on line 12 is less than approximately 33.7 volts. Similarly, as will be described below, diode 74 and diode 76 are also back biased and protect other portions of the circuit.

If the brightness level called for by the input signals is a normal level, that is, a 1,0 input signal level on lines 16, 18, then, according to the decoding logic, only switching elements 36, 38 are actuated to an "on" or short circuited state and switching element 40 is in the "off" state (open circulated). In this configuration, switching element 38 dominates and controls the voltage level on line 12 to be approximately 6 volts, the combined voltage drop across a zener diode 78, now forward biased diode 74, and transistor 44. In this configuration, diode 76 remains back biased. Thus, diode 74 completes the path from line 12 through zener diode 78 to ground. A capacitor 80, connected in parallel with zener diode 78, absorbs the overshoot, if any, which may occur when zener diode 78 turns on.

If the brightness called for by the input signals is a dim level, corresponding to a voltage level of about 18 volts on line 12 in the illustrated embodiment, the corresponding input signals over lines 16, 18, are 0,1. In this configuration, only switching element 36 is turned on and the output voltage over line 12 is determined by the combined voltage drops across zener diode 78, a zener diode 82, diodes 74, 76 and transistor 42. Zener diode 82 also has a capacitor 84 connected in parallel therewith to absorb any overshoot during turn on. In this configuration, both diodes 74 and 76 are in the forward biased or conducting mode.

Thus, the video amplifier 10 has a plurality of voltage determining devices, zener diodes 78 and 82 connected in series with each other through diodes 74, 76. The switching elements are actuated in accordance with the illustrated decoding circuitry outputs to provide a "priority" switching system in which the conducting (short circuited) switching element "closest" to the video output signal on line 12 determines the voltage on line 12. This configuration, in combination with the illustrated decoding logic, also ensures that one switching element never turns off when another switching element turns on, a condition which could provide an ambiguous video voltage signal if the turn on and turn off times are not identically matched. Such ambiguities can visually appear on the CRT face as unwanted bright spots or holes. Thus, according to the invention, there results on line 12, substantially a smoothly varying video signal level (substantially monotonic between video level changes) with substantially no overshoot or voltage ambiguities.

In order to further increase the switching speed of the video amplifier, the amplifier is assembled on a circuit board which is mounted directly on the socket of the cathode ray tube. This provides an increased speed of response. Typically, rise times on the order of 2-3 nanoseconds (corresponding to a bandwidth of 75-100 MHz.) can be attained using the following component values:

Transistors 42, 44, 46–Type 2N3646
Zener Diode 78—5.1 volts
Zener Diode 82—12 volts
Resistor 68—1.2 kilohms, 10 wts.
Resistor 86—22 kilohms
Resistors 48b, 50b—1 kilohm
Resistor 52b—680 ohms
Capacitors 48a, 50a, 52a—100 pf.
Capacitors 80, 84—2200 pf.
Diodes 72, 74, 76—Type 1N914

Other embodiments of the invention, including different component values and other additions, subtractions, deletions and modifications of the disclosed preferred embodiment, will be obvious to those skilled in the art and are within the scope of the following claims.

What is claimed is:

1. A video amplifier for generating at least four discrete output levels of video for a cathode ray tube display comprising
  input decoding means for receiving at least two digital input lines and providing at least three output signal lines, said output lines uniquely representing the signal state of said input lines, at least first, second, and third two-state switch elements, each switch element being associated with and responsive to a different one of said output signal lines, and each switch element providing, at respective first and second switch lines, a substantially short circuit, in response to a first state of said associated output signal line, and a substantially open circuit, in response to a second state of said associated output signal line, means for providing a black video reference level to a video output line which, when applied to said cathode ray tube display, has sufficient potential to turn said cathode ray tube substantially off, reference means associated with each switching element for connecting each first switch line to a common bright voltage reference level, voltage determining means associated with each switching element for connecting each second switch line to said video output line, and said input decoding means, said switching elements and said voltage determining means being connected to provide a priority switching system wherein the video line is held at the bright voltage reference level when the first switch element is in a first state, the video line is held at a normal voltage reference level when the second switch element is in said first state and the first switch element is in a second state, the video line is maintained at a dim reference voltage when the third switch element only is in said first state, the video line is maintained at said black video reference level when each switch element is in its second state, and changes on said video line from one reference voltage level to another reference voltage level, in response to a change of digital input signal, are substantially monotonic, whereby at least four voltage levels of video are obtained at the cathode ray tube display.

2. The amplifier of claim 1 including means for mounting said amplifier on a cathode ray tube pin socket.

3. The video amplifier of claim 1 wherein
each said reference means comprises a direct wire connection between said first switch line and said common bright voltage reference level.

4. The amplifier of claim 1 wherein said voltage determining means comprises a plurality of zener diodes connected in a series circuit between the second switch line of the first switch element and the second switch line of the third switch element.

5. The amplifier of claim 4 further comprising
means to isolate said zener diodes from each other and from said video reference line when said zener diodes are not conducting and
said zener diodes are each connected at an anode side to a second switch line of one of said second and third switching elements respectively.

6. The amplifier of claim 5 further including capacitive members connected in parallel with said zener diodes for preventing overshoot when said zener diodes turn on.

7. The amplifier of claim 1 wherein said means for providing a black video reference level comprises a first voltage source in series connection with a resistance connected in series with a limiting circuit comprising a diode in series with a second voltage source.

8. A video amplifier for generating four discrete output levels of video for a cathode ray tube display comprising input decoding means for receiving two digital input lines and providing three output signal lines, said output lines uniquely representing the signal state of said input lines, first, second, and third two-state switch elements, each switch element being associated with and responsive to a different one of said output signal lines, and each switch element providing, at respective first and second switch lines, a substantially short circuit, in response to a first state of said associated output signal line, and a substantially open circuit, in response to a second state of said associated output signal line, means for providing a black video reference level to a video output line which, when applied to said cathode ray tube display, has sufficient potential to turn said cathode ray tube substantially off, a direct wire connection associated with each switching element for connecting each first switch line to a common bright voltage reference level, voltage determining means associated with each switching element for connecting each second switch line to said video output line, said voltage determining means including a direct wire connection from the second switch line of said first switch element to said video output line, first and second zener diodes connected in a series circuit between said video output line and said second switch line of said third switch element, and said second switch line of said second switch element being connected to said series circuit between said zener diodes, said input decoding means, said switching elements and said voltage determining means being connected to provide a priority switching system wherein the video line is held at the bright voltage reference level when the first switch element is in a first state, the video line is held at a normal voltage reference level when the second switch element is in said first state and the first switch element is in a second state, the video line is maintained at a dim reference voltage when the third switch element only is in said first state, the video line is maintained at said black video reference level when each switch element is in its second state, and changes on said video line from one reference level to another reference voltage level, in response to a change of digital input signal, are substantially monotonic, whereby four voltage levels of video are obtained at the cathode ray tube display.

* * * * *